United States Patent
Carter et al.

(10) Patent No.: US 8,525,289 B2
(45) Date of Patent: Sep. 3, 2013

(54) ADJUSTING THRESHOLD VOLTAGE FOR SOPHISTICATED TRANSISTORS BY DIFFUSING A GATE DIELECTRIC CAP LAYER MATERIAL PRIOR TO GATE DIELECTRIC STABILIZATION

(75) Inventors: Richard Carter, Dresden (DE); Martin Trentzsch, Dresden (DE); Sven Beyer, Dresden (DE); Rohit Pal, Fishkill, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/444,955

(22) Filed: Apr. 12, 2012

(65) Prior Publication Data
US 2012/0193727 A1 Aug. 2, 2012

Related U.S. Application Data (62) Division of application No. 12/775,555, filed on May 7, 2010, now Pat. No. 8,198,192.

(30) Foreign Application Priority Data

May 15, 2009 (DE) .......... 10 2009 021 486

(51) Int. Cl.
*H01L 23/58* (2006.01)
(52) U.S. Cl.
USPC ........... 257/487; 257/288; 257/310; 257/758; 257/759; 257/E21.042; 257/E21.051; 257/E21.058; 257/E21.006; 257/E21.077; 257/E21.17; 257/E21.32; 257/E21.37; 257/E21.229; 257/E21.267; 257/E21.288

(58) Field of Classification Search
USPC ................. 257/288, 310, 322, 487, 758, 759, 257/E21.006, E21.077, E21, E21.042, E21.51, 257/E21.058, E21.17, E21.32, E21.37, E21.229, 257/E21.267
See application file for complete search history.

(56) References Cited

U.S. PATENT DOCUMENTS

| 6,287,897 B1 | 9/2001 | Gousev et al. ................ 438/142 |
| 8,198,192 B2 * | 6/2012 | Carter et al. .................. 438/623 |

(Continued)

FOREIGN PATENT DOCUMENTS

| DE | 112006001809 T5 | 5/2008 |
| EP | 1 531 496 A2 | 5/2005 |

(Continued)

OTHER PUBLICATIONS

Harris et al., "Band-Engineered Low PMOS $V_T$ with High-K/Metal Gates Featured in a Dual Channel CMOS Integration Scheme," *2007 Symposium on VLSI Technology Digest of Technical Papers*, pp. 154-155, 2007.
Translation of Official Communication from German Patent Office for German Patent Application No. 10 2009 021 486.0 dated Mar. 1, 2010.

(Continued)

*Primary Examiner* — David Nhu
(74) *Attorney, Agent, or Firm* — Williams, Morgan & Amerson, P.C.

(57) ABSTRACT

Sophisticated gate electrode structures may be formed by providing a cap layer including a desired species that may diffuse into the gate dielectric material prior to performing a treatment for stabilizing the sensitive gate dielectric material. In this manner, complex high-k metal gate electrode structures may be formed on the basis of reduced temperatures and doses for a threshold adjusting species compared to conventional strategies. Moreover, a single metal-containing electrode material may be deposited for both types of transistors.

7 Claims, 7 Drawing Sheets

(56) References Cited

U.S. PATENT DOCUMENTS

| | | | |
|---|---|---|---|
| 2003/0116795 A1 | 6/2003 | Joo | 257/296 |
| 2006/0021195 A1 | 2/2006 | Yamada et al. | 257/296 |
| 2007/0210354 A1 | 9/2007 | Nabatame et al. | 257/288 |
| 2008/0237604 A1 | 10/2008 | Alshareef et al. | 257/69 |
| 2009/0026557 A1 | 1/2009 | Yamaguchi et al. | 257/410 |
| 2009/0098693 A1 | 4/2009 | Nakajima | 438/199 |
| 2009/0114995 A1 | 5/2009 | Suzuki et al. | 257/369 |

FOREIGN PATENT DOCUMENTS

| | | |
|---|---|---|
| EP | 2 053 653 A1 | 4/2009 |
| JP | 2005-086023 | 3/2005 |
| JP | 2006-253267 | 9/2006 |

OTHER PUBLICATIONS

PCT Search Report from PCT/US2010/034164 dated Aug. 23, 2010.

\* cited by examiner

ADJUSTING THRESHOLD VOLTAGE FOR SOPHISTICATED TRANSISTORS BY DIFFUSING A GATE DIELECTRIC CAP LAYER MATERIAL PRIOR TO GATE DIELECTRIC STABILIZATION

CROSS-REFERENCE TO RELATED APPLICATIONS

This is a divisional of application Ser. No. 12/775,555, filed May 7, 2010, now U.S. Pat. No. 8,198,192, which claimed priority to German Patent Application No. 10 2009 021 486.0, filed May 15, 2009.

BACKGROUND OF THE INVENTION

1. Field of the Invention

Generally, the present disclosure relates to the fabrication of sophisticated integrated circuits including advanced transistor elements that comprise complex gate electrode structures including a sophisticated gate dielectric, such as a high-k gate dielectric, and a metal-containing electrode material.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed between the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity, which in turn causes an increase of gate resistivity due to the reduced dimensions, is a dominant design criterion for accomplishing an increase in the operating speed of the integrated circuits.

Presently, the vast majority of integrated circuits are based on silicon, due to its substantially unlimited availability, the well-understood characteristics of silicon and related materials and processes and the experience gathered during the last 50 years. Therefore, silicon will likely remain the material of choice for future circuit generations produced by volume production techniques. One reason for the dominant role of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, during anneal cycles to activate dopants and to cure crystal damage, without sacrificing the electrical characteristics of the interface.

For the reasons pointed out above, in field effect transistors, silicon dioxide is preferably used as a base material for a gate insulation layer that separates the gate electrode, frequently comprised of polysilicon and metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a very pronounced dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required high capacitance between the gate and the channel region. For example, a channel length of approximately 80 nm may require a gate dielectric made of silicon dioxide as thin as approximately 1.2 nm. Although the usage of high speed transistor elements having an extremely short channel may be restricted to high speed signal paths, whereas transistor elements with a longer channel may be used for less critical circuit portions, such as storage transistor elements, the relatively high leakage current caused by direct tunneling of charge carriers through an ultra-thin silicon dioxide gate insulation layer may reach values for an oxide thickness in the range or 1-2 nm that may not be compatible with requirements for performance driven circuits, even if only transistors in speed critical paths are formed on the basis of an extremely thin gate oxide.

Therefore, various measures have been proposed for increasing the dielectric strength and the effective dielectric constant of the silicon dioxide material, such as performing treatments on the basis of nitrogen in order in incorporate a certain amount of nitrogen. Although these treatments of the base oxide material provide significant improvements, the further scaling of the transistor dimensions may demand even further sophisticated approaches. To this end, replacing silicon dioxide as the material for gate insulation layers has been considered, particularly for extremely thin silicon dioxide based gate layers. Possible alternative materials include materials that exhibit a significantly higher permittivity so that a physically greater thickness of a correspondingly formed gate insulation layer provides a capacitive coupling that would be obtained by an extremely thin silicon dioxide based layer. It has thus been suggested to replace at least a portion of the conventional silicon dioxide with high permittivity materials such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides an increased capacitance based on the same or greater thickness as a silicon dioxide based layer, while additionally maintaining leakage currents at an acceptable level. On the other hand, the non-polysilicon material, such as titanium nitride and the like, may be formed so as to connect to the high-k dielectric material, thereby substantially avoiding the presence of a depletion zone.

After forming sophisticated gate structures including a high-k dielectric material, however, high temperature treatments and other processes are required which may significantly affect the high-k material.

For this reason, many high-k dielectric materials may be subjected to a postdeposition treatment in order to achieve superior stability of the material characteristics during the further processing. For example, an encapsulation of the high-k dielectric material may typically be necessary in order to reduce the interaction with metal-containing electrode materials and other process environments encountered during the further processing of the device. Furthermore, the crystallization temperature of the high-k dielectric material may have to be increased to provide superior stability during subsequent high temperature processes that may typically be required for completing the basic transistor configuration. Other material modifications may involve a phase separation of the high-k dielectric materials and also diffusion of implantation species, which may be incorporated into an upper portion of the gate electrode structures during the further processing, may have to be blocked. Moreover, a shift of the work function and a reduction of the permittivity of the high-k dielectric material, which may be associated with an increase of layer thickness, may result in a significant threshold voltage variation of the transistor, which is believed to be caused by a substantial interaction of the gate stack materials with oxygen. For example, hafnium oxide and zirconium oxide may exhibit a very high oxidation rate in the presence of oxygen and elevated temperatures, thereby resulting in a pronounced modification of the material characteristics which may thus lead to a significant variability of transistor characteristics. Consequently, it may be very difficult to accurately adjust the threshold voltage of transistors on the basis of a high-k dielectric material that is provided in an early manufacturing stage. In some conventional approaches, a certain degree of stabilization of material characteristics may be accomplished by a treatment of the high-k dielectric material immediately after deposition, for instance in the form of nitridation and the like, in order to enhance the further processing of the sensitive gate dielectric materials. On the other hand, the threshold voltage of the transistors may have to be specifically adjusted on the basis of a specific work function metal in combination with the high-k dielectric material. In some conventional approaches, the threshold voltage adjustment may be accomplished by incorporating a certain metal species into the high-k dielectric material in order to obtain a desired work function in combination with a metal-containing material formed on the high-k dielectric layer. One efficient technique for incorporating the desired metal species into the high-k dielectric material is the provision of a cap layer including the desired diffusion species and performing a heat treatment to initiate the diffusion of the metal species into the high-k dielectric material. The incorporation of the desired metal species for N-channel transistors and P-channel transistors may typically be performed at any appropriate manufacturing stage, for instance, in a very late stage after completing the basic transistor configuration or in an early manufacturing stage, i.e., after providing the stabilized high-k dielectric material and forming a cap layer thereon, which may contain the desired metal species for the transistor under consideration. Due to the superior stability of the high-k dielectric material, however, moderately high process temperatures and concentrations of the desired metal species are required, which may negatively influence transistor characteristics, thereby reducing the finally achieved overall performance of the transistors.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques and semiconductor devices in which enhanced integrity and thus stability of a high-k dielectric material may be achieved on the basis of an appropriate treatment, such as nitridation, oxidation and the like, wherein, prior to the stabilization of the material characteristics, a desired threshold adjusting species may be incorporated into the high-k dielectric material. To this end, the high-k dielectric material and an appropriate cap layer or cap layers may be formed prior to performing the stabilizing treatment so that superior performance of the diffusion process may be accomplished, wherein, after incorporating the threshold adjusting species in the high-k dielectric material, the subsequent stabilization may provide superior integrity and thus stability of the resulting threshold voltage. Consequently, after incorporating the desired threshold adjusting species into the high-k dielectric material, any appropriate electrode material may be deposited on the high-k dielectric material, which may be accomplished in an early manufacturing stage or after completing the basic transistor configuration.

One illustrative method disclosed herein comprises forming a gate dielectric material above a semiconductor region of a semiconductor device, wherein the gate dielectric material comprises a high-k dielectric material. The method further comprises forming a metal-containing material above the gate dielectric material, wherein the metal-containing material comprises a threshold voltage adjusting species. Moreover, a heat treatment is performed to diffuse a portion of the threshold adjusting species into the gate dielectric material. The method additionally comprises removing the metal-containing material from above the gate dielectric material and performing a treatment to stabilize the gate dielectric material. Additionally, a metal-containing electrode material is formed on the gate dielectric material. Additionally, the method comprises forming a gate electrode structure of a transistor on the basis of the metal-containing electrode material and the gate dielectric material.

A further illustrative method disclosed herein comprises forming a gate dielectric material above a first active region and a second active region. Additionally, a first metal-containing material is selectively formed above the first active region. The method additionally comprises forming a second metal-containing material above the second active region.

Furthermore, the method comprises performing a heat treatment to initiate diffusion of a first species from the first metal-containing material in the gate dielectric material above the first active region and to initiate diffusion of the second species from the second metal-containing material into the gate dielectric material above the second active region. Additionally, the method comprises removing the first and second metal-containing materials and performing a treatment to stabilize the gate dielectric material.

One illustrative semiconductor device disclosed herein comprises a first active region and a first gate electrode structure formed on the first active region. The first gate electrode structure comprises a dielectric base material and a high-k dielectric material formed on the dielectric base material, wherein the high-k dielectric material comprises a first threshold adjusting metal species in the first gate electrode structure. The semiconductor device further comprises a second active region and a second gate electrode structure formed on the second active region. The second gate electrode structure comprises the dielectric base material and the high-k dielectric material formed on the dielectric base material, wherein the high-k dielectric material comprises a second threshold adjusting metal species in the second gate electrode structure. Additionally, the semiconductor device comprises a metal-containing electrode material that is formed on the high-k dielectric material in the first and second gate electrode structures.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and techniques in which sensitive gate dielectric materials may be treated to receive an appropriate species for adjusting overall transistor characteristics, such as the threshold voltage and the like, prior to performing a treatment for stabilizing the material characteristics of the gate dielectric layer. As previously explained, the principles disclosed herein may be advantageously applied to sensitive high-k dielectric materials which may have a tendency for changing material characteristics upon exposure to certain environmental conditions or process conditions that may be applied during the further processing of the semiconductor device. According to the principles disclosed herein, the desired transistor characteristics, for instance with respect to threshold voltage, may be adjusted after the deposition of the sensitive dielectric material and prior to any stabilizing treatment in order to enhance the efficiency of the incorporation of the desired species, such as a metal species. Consequently, the desired species may be incorporated by diffusion on the basis of less demanding process conditions, i.e., on the basis of a reduced process temperature and concentration, such that other device characteristics may be less affected by the threshold adjustment.

Based on the subsequent preservation of the material characteristics by any appropriate modification, such as nitridation and the like, the further processing may be continued by providing a single electrode metal for both types of transistors, thereby increasing the overall process efficiency.

In some illustrative embodiments, the adjustment of transistor characteristics on the basis of incorporating a species into the sensitive dielectric material prior to the stabilization thereof may also be applied to sophisticated "conventional" gate dielectric materials, such as silicon dioxide-based materials, in combination with appropriate gate electrode materials, such as polysilicon, silicon/germanium and the like. Consequently, unless specifically set forth in the embodiments described herein or in the appended claims, the dielectric gate material should not be considered as being restricted to high-k dielectric materials.

Figure 1A:
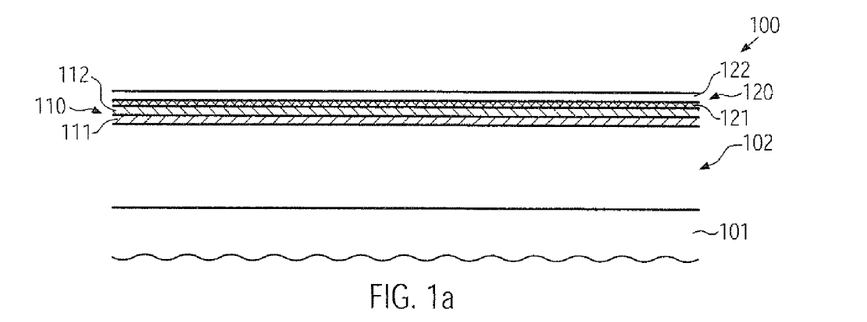
FIGS. 1a-1g schematically illustrate cross-sectional views of a semiconductor device during various manufacturing stages in forming a sophisticated gate electrode structure on the basis of a high-k dielectric material and a metal electrode material, wherein a threshold adjusting species may be incorporated into the high-k dielectric material prior to stabilizing the material characteristics thereof, according to illustrative embodiments.

FIG. 1a schematically illustrates the cross-sectional view of a semiconductor device 100 comprising a substrate 101 above which may be formed a semiconductor layer 102. The substrate 101 may represent any appropriate carrier material for forming thereabove the semiconductor layer 102 and may comprise a crystalline substrate material, an insulating material and the like. For example, a buried insulating layer may be formed on a substantially crystalline substrate material, followed by the semiconductor layer 102, thereby forming a silicon-on-insulator (SOI) configuration. The semiconductor material 102 may represent any appropriate material, such as a silicon material, possibly in combination with other components, such as germanium, carbon and the like, in order to obtain the desired transistor characteristics. In the manufacturing stage shown in FIG. 1a, the portion of the semiconductor layer 102 illustrated may represent an active region of a transistor and may thus include a certain basic doping level in order to define the basic transistor characteristics, such as the conductivity type thereof. In this respect, an active region is to be understood as a portion of the semiconductor layer 102, which may be laterally delineated by an appropriate isolation structure (not shown) and which may comprise or receive appropriate dopant profiles in order to form one or more PN junctions therein.

Moreover, the semiconductor device 100 may comprise a gate dielectric material 110 formed on the semiconductor layer 102. In some illustrative embodiments, the gate dielectric material 110 may comprise a high-k dielectric material 112, such as hafnium oxide, zirconium oxide, hafnium silicon oxide and the like, depending on the overall process and device requirements. When a direct contact of the high-k dielectric material 112 with the semiconductor layer 102 may be considered inappropriate, for instance in view of thermal stability and the like, a dielectric base layer 111 may be provided to act as an interface between the high-k dielectric material 112 and the semiconductor layer 102. For example, the material 111 may represent a "conventional" silicon dioxide-based material having a desired reduced thickness of, for instance, approximately 1 nm and less. On the other hand, a combined thickness and relative permittivity of the gate dielectric material 110 may be selected so as to correspond to the desired transistor characteristics, possibly in combination with a certain modification of the characteristics of the dielectric material 110 in a later manufacturing stage. As previously explained, the material characteristics of the dielectric material 110 may be moderately variable, for instance with respect to one or more of the above-described influences, so that a stabilization of the material characteristics may be provided in a later manufacturing stage in which an additional adaptation, for instance, the overall dielectric constant, may also be accomplished by incorporating an appropriate species, such as nitrogen, oxygen and the like.

Furthermore, in the manufacturing stage shown, a cap layer 120 may be formed on the dielectric material 110 and may comprise any appropriate species that may be incorporated into the dielectric material 110 in order to adjust the characteristics thereof, for instance, with respect to a threshold voltage of a transistor that has to be formed on the basis of the gate dielectric material 110. Additionally, the cap layer 120 may also provide superior integrity of the gate dielectric material 110 during the further processing. In one illustrative embodiment, the cap layer 120 may comprise a first layer 121, which may comprise a desired diffusion species, such as a metal, that may be incorporated into the dielectric material 110 in order to obtain the desired work function and thus threshold voltage adjustment for a transistor still to be formed in and above the semiconductor layer 102. For example, the layer 121 may comprise a diffusion species in the form of aluminum, tantalum and the like, which may represent appropriate candidates for adjusting the threshold voltage of a P-channel transistor and an N-channel transistor, respectively. For example, the layer 121 may be provided in the form of a lanthanum layer with a thickness of several Angstrom, when an N-channel transistor is to be formed on the basis of the gate dielectric material 110. Furthermore, a second layer 122 may be provided, for instance, in the form of titanium nitride and the like, which may efficiently provide superior integrity during the further processing. It should be appreciated that the cap layer 120 may comprise additional layers, such as an additional titanium nitride layer directly formed on the high-k dielectric material 112, if considered appropriate for the further processing.

The semiconductor device 100 as illustrated in FIG. 1a may be formed on the basis of the following processes. After forming corresponding isolation structures (not shown) and introducing a dopant species into the layer 102 in order to adjust basic transistor characteristics, the gate dielectric material 110 may be formed, for instance, on the basis of sophisticated deposition techniques, possibly in combination with oxidation processes and the like. For example, the layer 111, if provided, may be formed on the basis of thermal oxidation, wet chemical oxidation and the like, when a silicon dioxide material is to be provided. Thereafter, the high-k dielectric material 112 may be deposited on the basis of well-established deposition techniques, such as chemical vapor deposition (CVD) and the like. For instance, in sophisticated applications, the high-k dielectric material may be deposited with a thickness of 10-20 Å, when, for instance, hafnium oxide may be used as the high-k dielectric material. Thereafter, the cap layer 120 may be formed on the basis of any well-established deposition recipes, such as forming titanium nitride on the basis of CVD and the like. Similarly, the diffusion species-containing layer, such as the layer 121, may be deposited by CVD and the like.

Figure 1B:
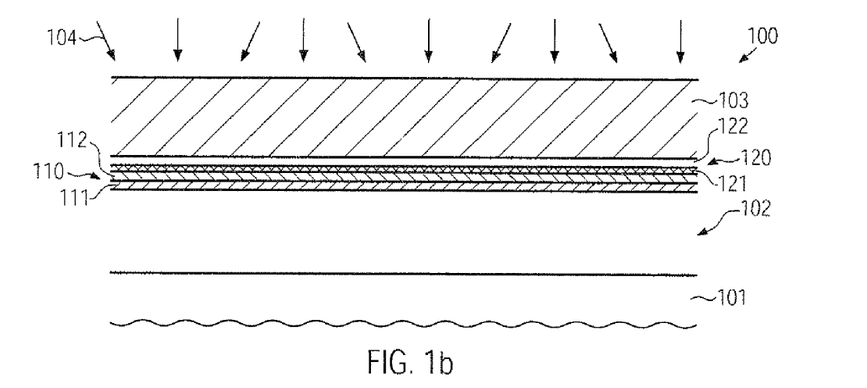

FIG. 1b schematically illustrates the semiconductor device 100 in a further advanced manufacturing stage in which the device 100 may be exposed to a further deposition ambient 104 in order to form a protection layer 103 on the cap layer 120. The protection layer 103 may be comprised of any appropriate material, such as a silicon material and the like, which may be removed with high efficiency in a later manufacturing stage without unduly compromising integrity of the gate dielectric material 110. The protection layer 103 may be provided for increasing integrity of the cap layer 120 when exposure thereof to a process ambient may be considered inappropriate during the further processing. For example, titanium nitride exhibits a significant oxidation rate when exposed to the ambient atmosphere at elevated temperatures. In other cases, the protection layer 103 may act as an efficient heat distribution layer, for instance in the case of sophisticated anneal techniques that may be used during the further processing of the device 100. It should be appreciated that a plurality of well-established process recipes are available and may be used during the deposition process 104. For instance, a thickness of the layer 103 may be selected in the range of 10-30 nm, while other values may also be selected if considered appropriate.

Figure 1C:
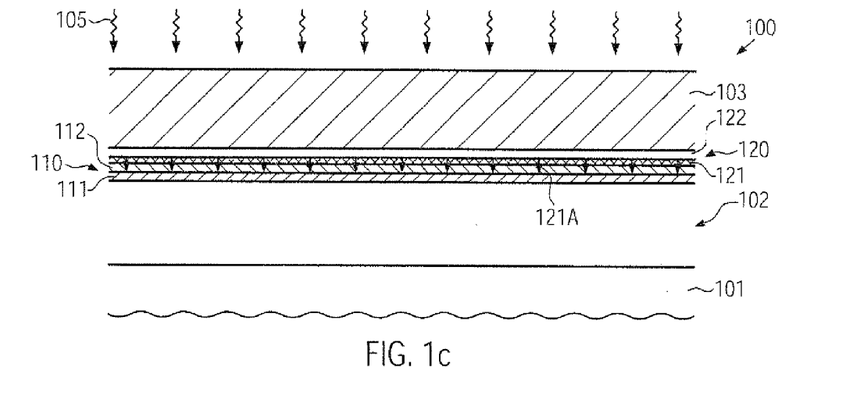

FIG. 1c schematically illustrates the semiconductor device 100 when exposed to elevated temperatures during an anneal process 105, during which a desired diffusion species is initiated to diffuse from the cap layer 120 into the dielectric material 110. During the anneal process 105, the effective process temperature and the duration may thus be appropriately selected to obtain a desired concentration of the diffusion species, i.e., the threshold adjusting species within the dielectric material 110, wherein, however, as previously explained, the less pronounced "stability" of the dielectric material 110 may provide superior process conditions during the process 105. Consequently, with temperatures of approximately 900° C. and higher, an efficient diffusion may be initiated wherein duration and temperature may be selected so as to appropriately position the species under consideration, such as, for example, lanthanum, aluminum and the like, at a desired depth within the gate dielectric material 110. Hence, a species 121A, which may be comprised in the layer 121 or in the layer 122, as previously explained, may diffuse into the dielectric material 110 with a desired concentration. In some illustrative embodiments, the process 105 may be controlled such that a certain amount of the species may also diffuse into the base layer 111, if considered appropriate for adjusting the overall characteristics of the dielectric material 110. Appropriate process parameters for the anneal process 105 may be readily determined on the basis of experiments in which the diffusion rate of a desired species may be obtained for the dielectric material 110. The anneal process 105 may be performed on the basis of any appropriate anneal technique, such as rapid thermal anneal processes, laser-based anneal processes, flashlight-based anneal processes and the like. In some illustrative embodiments, the anneal process 105 may be performed on the basis of a laser-based system in which radiation may be supplied to the device 100 in a locally resolved manner, thereby providing the possibility of adjusting the threshold voltage of transistors in a locally different manner. For example, in some device regions, a higher threshold voltage may be desirable which may be accomplished by appropriately adjusting the effective exposure time and temperature during the process 105, which may thus result in a corresponding change of the diffusion of the species 121A into the dielectric material 110. Consequently, different "flavors" of transistors may be obtained by locally differently adjusting the amount and/or the penetration depth of the species 121A in the dielectric material 110. For this purpose, well-established laser-based anneal systems may be used in combination with corresponding position information in order to appropriately adjust anneal parameters by, for instance, adapting the scan motion of the corresponding anneal system and the like. As previously explained, during the anneal process 105, the protection layer 103, if provided, may ensure integrity of the cap layer 120 and may, if required, enhance performance of the anneal process 105, for instance with respect to absorbing radiation energy if the cap layer 120 may exhibit increased reflectivity and the like.

Figure 1D:
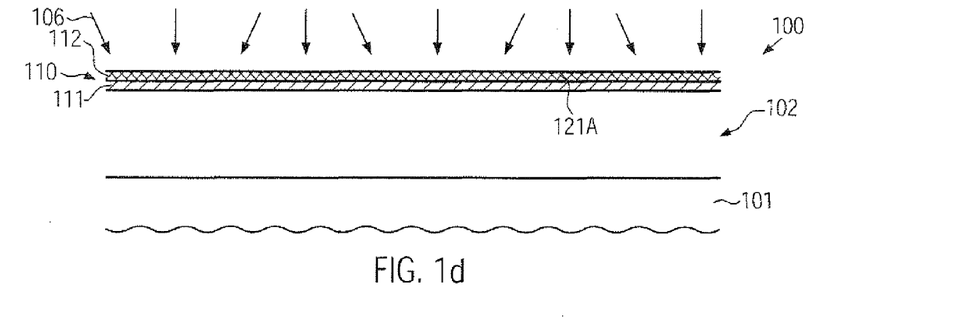

FIG. 1d schematically illustrates the semiconductor device 100 in a further advanced manufacturing stage. As illustrated, the device 100 may be exposed to one or more reactive processes 106, during which the protection layer 103 and the cap layer 120 (FIG. 1c) may be removed. For example, the etch sequence 106 may comprise any appropriate etch chemistry for removing the protection layer 103, for instance on the basis of ammonium hydroxide and the like, tetra methyl ammonium hydroxide (TMAH) and the like, in order to remove silicon material selectively to the cap layer. In other cases, any other appropriate etch recipe may be used, depending on the material composition of the protection layer 103 shown in FIG. 1c. Thereafter, the cap layer 120 (FIG. 1c) may be removed, for instance, on the basis of a wet chemical etch recipe using an ammonium peroxide mixture (APM), which may efficiently remove materials such as titanium nitride and the like, in combination with the diffusion layer 121 (FIG. 1c), while stopping at the dielectric material 110, as, for instance, a plurality of high-k dielectric materials may exhibit enhanced etch stop capabilities with respect to a plurality of etch recipes. Consequently, in some illustrative embodiments, the gate dielectric material 110 may be exposed during the etch sequence 106 and may thus be prepared for the further treatment to provide superior stability of the gate dielectric material 110. It should be appreciated that the dielectric material 110 may contain therein a certain amount of the species 121A due to the preceding anneal process 105 (FIG. 1c). For example, the diffusion species 121A may be formed in the layer 112, while, in other embodiments, the species 121A may also extend into the base layer 111.

Figure 1E:
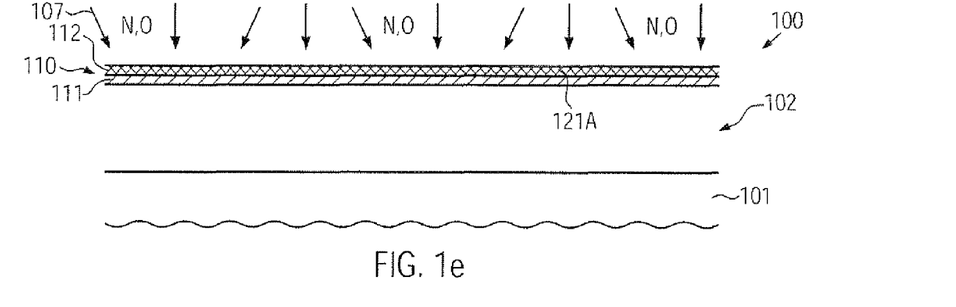

FIG. 1e schematically illustrates the semiconductor device 100 during a further treatment 107 that may be performed on the basis of any appropriate process techniques for increasing the stability of the gate dielectric material 110 in view of further high temperature processes, exposure to other process conditions and the like, as previously explained. In particular, the process 107 may impart increased stability to the gate dielectric material 110 with respect to interdiffusion of other species, thereby stabilizing and thus substantially maintaining the distribution of the species 121A within the dielectric material 110, which may thus result in a reduced degree of variability of the finally obtained threshold voltage. In some illustrative embodiments, the treatment 107 may include a nitridation process, possibly in combination with an oxidation step, in order to incorporate nitrogen, possibly in combination with oxygen, into at least an upper portion of the gate dielectric material 110. For this purpose, any appropriate process techniques may be used, such as plasma-based treatments in a nitrogen-containing atmosphere and the like. Similarly, an oxidation may be applied if considered appropriate, wherein plasma-based oxidation recipes may be used, thereby avoiding undue elevated temperatures, which may otherwise result in a significant diffusion of the species 121A at an initial phase of the treatment 107. In some illustrative embodiments, the process parameters of the treatment 107 may be selected such that a desired species, such as nitrogen, may also be incorporated into the base layer 111, if provided, thereby also enhancing the characteristics thereof, for instance, with respect to the resulting dielectric constant, diffusion blocking behavior and the like. Consequently, during the treatment 107, the characteristics of the layer 110 may be adjusted and may be concurrently "conserved" since the dielectric material 110 may exhibit a significantly enhanced stability during the further processing, as is also previously explained.

Figure 1F:
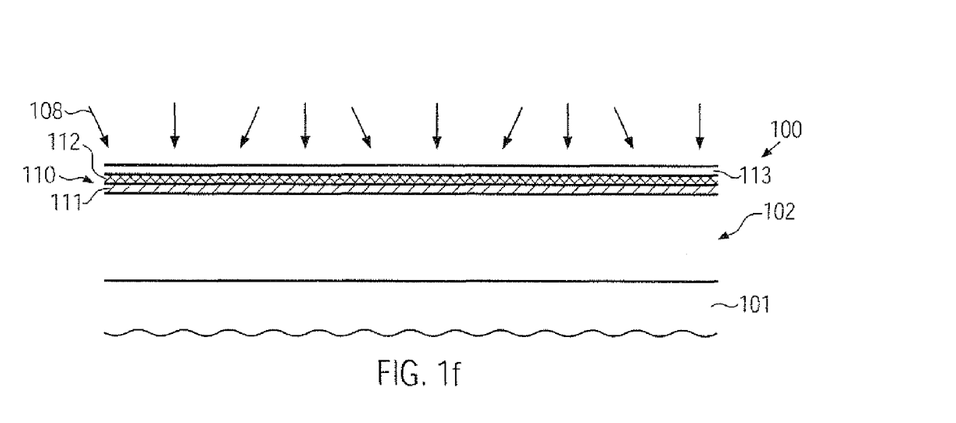

FIG. 1f schematically illustrates the semiconductor device 100 during a further deposition process 108 during which any appropriate metal-containing electrode material 113 may be provided on the gate dielectric material 110. For example, the metal-containing electrode material 113 may be provided in the form of titanium nitride with a thickness of approximately 1-10 nm, wherein, however, any other values may be selected, depending on the overall process strategy. The deposition process 108 may be performed on the basis of any well-established process recipe.

Figure 1G:
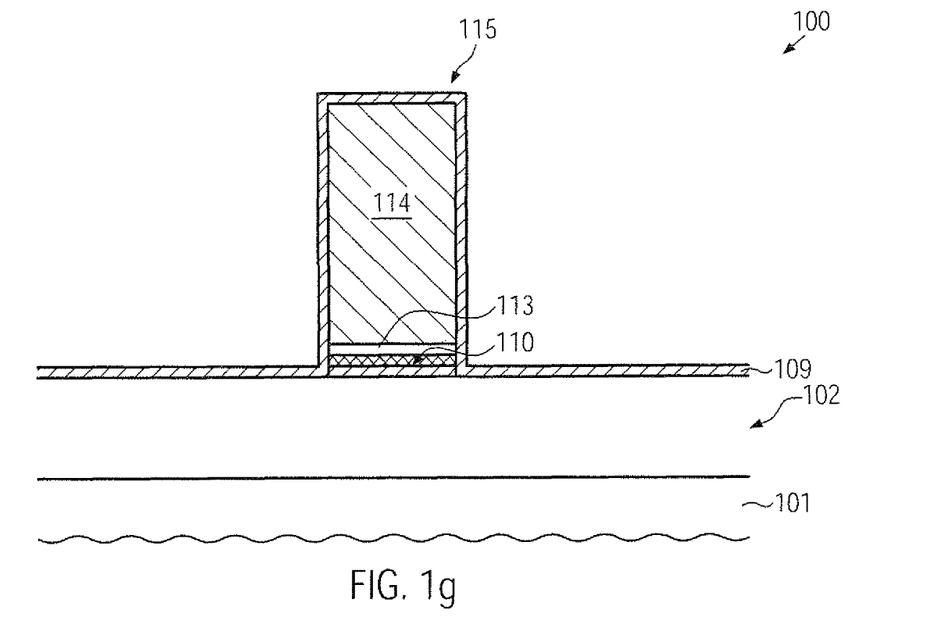

FIG. 1g schematically illustrates the semiconductor device 100 in a further advanced manufacturing stage. As illustrated, a gate electrode structure 115 may be formed above the semiconductor layer 102 and may comprise the gate dielectric material 110 with a superior stability and with appropriately set characteristics, for instance, with respect to a threshold voltage, as explained above. Furthermore, the metal-containing electrode material 113 may be formed on the dielectric material 110, followed by a further electrode material or placeholder material 114, for instance in the form of silicon, silicon/germanium and the like. It should be appreciated that the material 114 may also comprise additional materials, such as a cap layer, if required for the further processing of the semiconductor device 100. Moreover, a protection liner 109, for instance comprised of silicon nitride, may be formed on the semiconductor layer 102 and the gate electrode structure 115, thereby providing superior integrity of the gate electrode structure 115 during the further processing. For instance, the protection liner 109 may be exposed to an anisotropic etch ambient in a subsequent manufacturing stage in order to form corresponding sidewall spacer elements for the gate electrode structure 115, thereby maintaining integrity of the sidewalls thereof during the further processing.

The semiconductor device 100 as illustrated in FIG. 1g may be formed on the basis of well-established process techniques in which the material 114 may be deposited on the electrode material 113, possibly in combination with additional cap materials and the like. Thereafter, a complex patterning process sequence may be performed, including sophisticated lithography and etch techniques, in order to form the gate electrode structure 115, followed by the deposition of the material 109, which may be accomplished on the basis of thermally activated CVD techniques and the like. Hence, the gate electrode structure 115 may be provided with the gate dielectric material 110 in a stabilized condition, while a threshold voltage may be adjusted on the basis of the dielectric material 110 and the electrode material 113 for a transistor to be formed on the basis of the gate electrode structure 115.

With reference to FIGS. 2a-2j, further illustrative embodiments will now be described in which transistor characteristics, such as the threshold voltage, may be adjusted prior to stabilizing a sensitive dielectric material for different types of transistors.

Figure 2A:
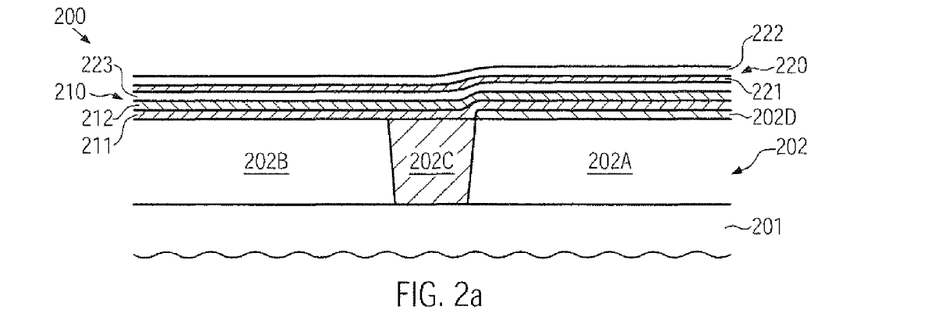
FIGS. 2a-2j schematically illustrate cross-sectional views of a semiconductor device during various manufacturing stages in forming gate electrode structures of different transistor types, in which the threshold adjusting species may be incorporated prior to stabilizing the high-k dielectric material, according to further illustrative embodiments.

FIG. 2a schematically illustrates a cross-sectional view of a semiconductor device 200 which may comprise a substrate 201, above which may be formed a semiconductor layer 202. With respect to the substrate 201 and the semiconductor layer 202, the same criteria may apply as previously explained with reference to the device 100. Moreover, an isolation structure 202C may separate a first active region 202A from a second active region 202B. For example, the first active region 202A may represent an N-doped well region in and above which a P-channel transistor is to be formed during the further processing. Similarly, the active region 202B may represent the active region of an N-channel transistor. It should be appreciated, however, that the following sequence of processes may also be applied to the configuration in which the active region 202A may represent an N-channel transistor while the active region 202B may represent a P-channel transistor. Furthermore, in the manufacturing stage shown, a gate dielectric material 210 may be formed above the first and second active regions 202A, 202B followed by a cap layer 220. In the embodiment shown, the dielectric material 210 may comprise a dielectric base layer 211, such as a silicon dioxide-based material and the like, in combination with a high-k dielectric material layer 212. It should be appreciated, however, that the dielectric material 210 may be provided in the form of a single material layer or may comprise three or more sub-layers, if considered appropriate. Similarly, the cap layer 220 may comprise any appropriate structure for providing a material 221, which may include a diffusion species that is appropriately selected so as to adjust the threshold voltage for a transistor to be formed in and above the active region 202A. For example, the cap layer 220 may comprise the material 221 and a first and a second cap layer 222, 223, for instance comprised of titanium nitride and the like, which may enclose the material layer 221. For example, the layer 221 may be comprised of lanthanum or aluminum, depending on the type of transistor whose threshold voltage is to be adjusted on the basis of the material layer 221. In the embodiment shown, the layer 221 may represent an aluminum layer with a thickness of approximately 0.5-1.5 nm, while the layers 222, 223 may have a thickness of 1-3 nm, for example. Furthermore, in one illustrative embodiment, the active region 202A may comprise an appropriately selected semiconductor material 202D, for instance in the form of a silicon/germanium alloy, in order to provide a desired band gap offset that results, in combination with a corresponding incorporation of the species in the layer 221, for an appropriate threshold voltage for a P-channel transistor.

The semiconductor device 200 as illustrated in FIG. 2a may be formed on the basis of the following processes. After forming the isolation structure 202C, the basic dopant profile of the active regions 202A, 202B may be established on the basis of well-established masking regimes in combination with implantation processes. Thereafter, the semiconductor alloy 202D may be selectively formed on the active region 202A, which may be accomplished by using selective epitaxial growth techniques in combination with an appropriate masking regime for covering the active region 202B during the deposition process. Thereafter, the gate dielectric material may be formed in any appropriate manner, as is also described above with reference to the device 100. Thereafter, the cap layer 220 may be deposited using well-established deposition techniques, as previously discussed.

Figure 2B:
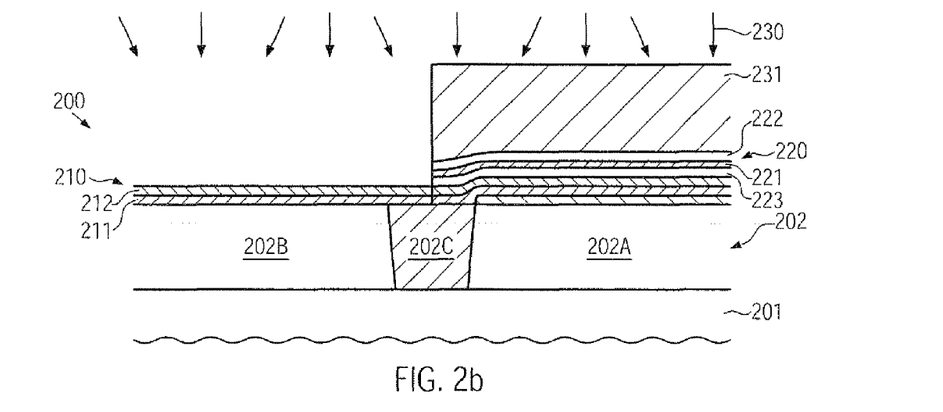

FIG. 2b schematically illustrates the semiconductor device 200 when exposed to an etch ambient 230 for selectively removing the cap layer 220 from above the active region 202B on the basis of an etch mask 231, such as a resist mask. The etch process 230 may be performed on the basis of similar etch techniques, as previously described with reference to the etch sequence 106 in FIG. 1d. Consequently, the material 221 including the desired diffusion species, such as aluminum, may be selectively formed above the active region 202A.

Figure 2C:
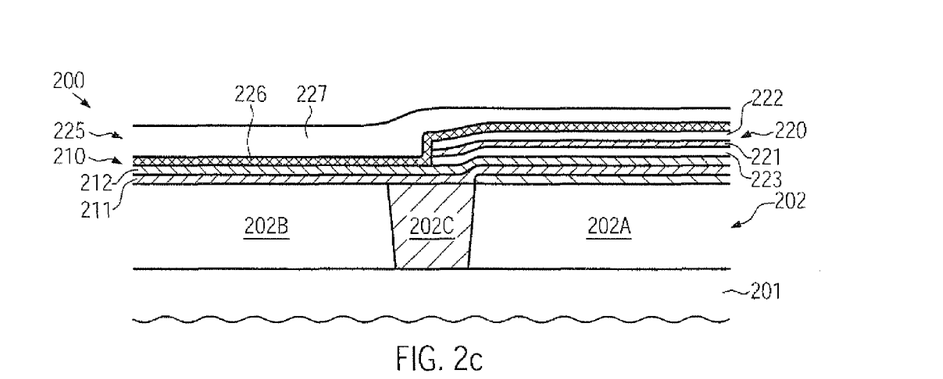

FIG. 2c schematically illustrates the semiconductor device 200 with a further cap layer 225 formed above the active regions 202A, 202B. The cap layer 225 may comprise any appropriate configuration for providing a diffusion species in a layer 226, possibly in combination with one or more additional cap materials 227. For example, the layer 226 may include a diffusion species that may enable an appropriate adjustment of the threshold voltage of the transistor to be formed in and above the active region 202B. In the example shown, the layer 226 may comprise lanthanum, which may represent an appropriate candidate for adjusting the threshold voltage of an N-channel transistor. The additional cap material 227 may comprise titanium nitride, or any other appropriate material composition. With respect to any process techniques for forming the cap layer 225, it may be referred to the layers 221 and 121 previously described.

Figure 2D:
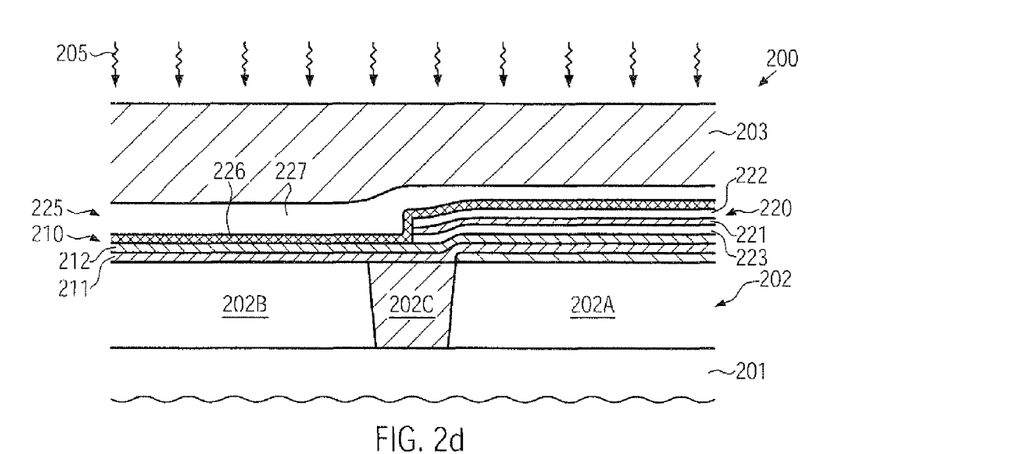

FIG. 2d schematically illustrates the semiconductor device 200 in a further advanced manufacturing stage. As illustrated, a protection layer 203, for instance comprised of silicon or any other appropriate material, may be formed above the cap layer 225. Furthermore, the device 200 may be exposed to elevated temperatures during an anneal process 205 in order to initiate the diffusion of the corresponding species in the cap layers 225 and 220 into the dielectric material 210. Consequently, a species of the layer 226, such as lanthanum, may efficiently diffuse into the dielectric material 210 above the active region 202B, while a corresponding pronounced lanthanum diffusion may be suppressed in the layer 222 of the cap layer 220 formed above the active region 202A. On the other hand, the species in the layer 221 may efficiently diffuse into the dielectric material 210 above the active region 202A. In this manner, the threshold voltage adjustment for different types of transistors may be accomplished during the anneal process 205, wherein a certain degree of individual adaptation of the diffusion behavior may be accomplished, for instance, by providing the layer 223, which may thus result in a certain "diffusion resistance," thereby allowing a desired adaptation for a given set of process parameters of the process 205. It should be appreciated that, with respect to adapting the threshold voltage in different device regions of the device 200, the same criteria may apply as previously explained. That is, if desired, different anneal parameters may be locally applied in order to obtain different "flavors" of transistor elements.

Figure 2E:
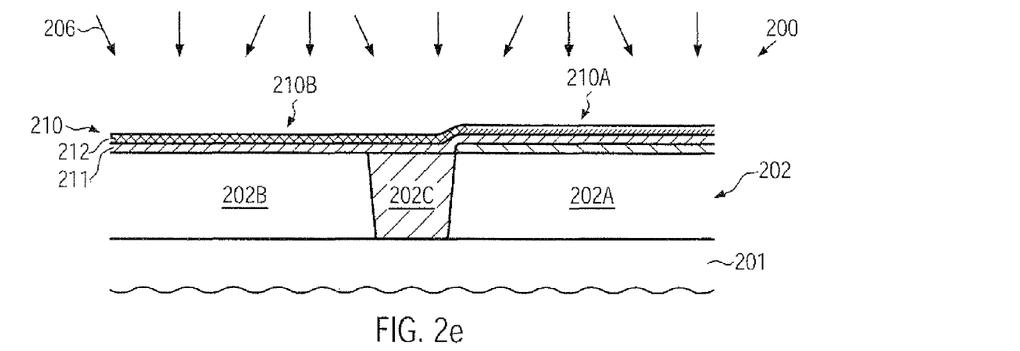

FIG. 2e schematically illustrates the semiconductor device 200 when exposed to a sequence of etch processes 206, during which the protection layer 203 and the cap layers 225 and 220 (FIG. 2d) may be removed, thereby exposing the gate dielectric material 210 which may have a different material composition above the active regions 202A, 202B, as indicated by 210A, 210B, due to the incorporation of a different type of diffusion species, as explained above. The etch sequence 206 may be performed on the basis of similar etch recipes, as previously explained with reference to the etch sequence 106 of FIG. 1d. Consequently, after the etch sequence 206, the gate dielectric material 210 may be exposed and may thus be prepared for a further treatment for enhancing the stability thereof.

Figure 2F:
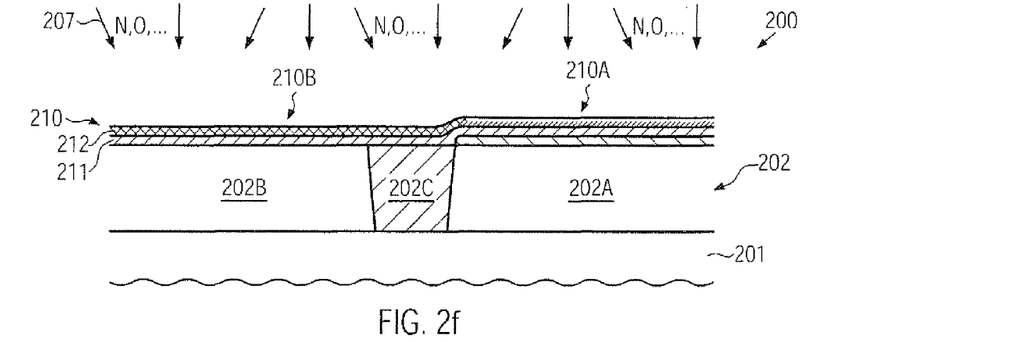

FIG. 2f schematically illustrates the semiconductor device 200 during a treatment 207 for stabilizing the characteristics of the dielectric layer 210, thereby also stabilizing the distribution and concentration of the corresponding diffusion species that may provide different dielectric materials 210A, 210B above the active regions 202A, 202B. With respect to the treatment 207, similar criteria may apply as previously explained. That is, nitrogen and/or oxygen may be incorporated on the basis of appropriately selected process parameters in order to adjust the "final" characteristics of the gate dielectric materials 210A, 210B and also provide superior stability during the further processing.

Figure 2G:
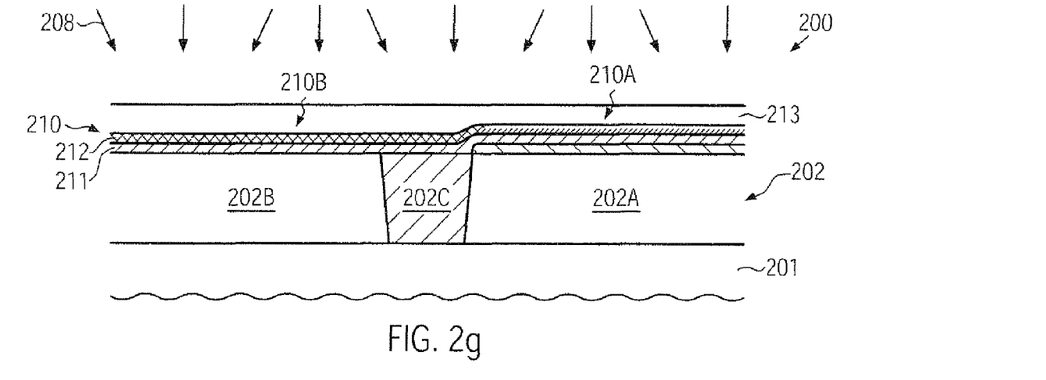

FIG. 2g schematically illustrates the semiconductor device 200 during a deposition process 208 in which a metal-containing electrode material 213 may be formed above the active regions 202A, 202B. That is, the electrode material 213 may, in some illustrative embodiments, be directly formed on the gate dielectric material 210, i.e., the corresponding portions of different characteristics 210A, 210B, without requiring different work function metals, as may be the case in conventional approaches in which the actual threshold voltages may be adjusted in a later manufacturing stage. With respect to appropriate materials and deposition techniques, it may be referred to the semiconductor device 100.

Figure 2H:
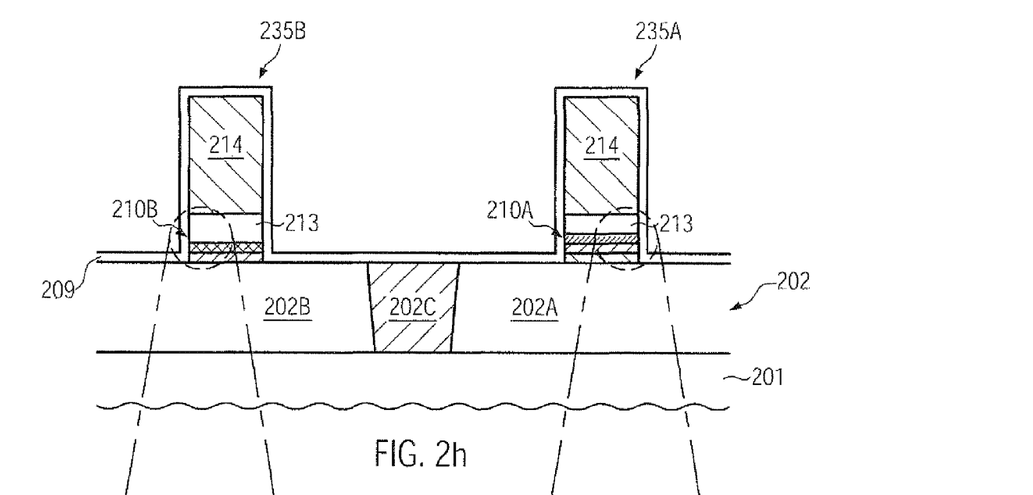

FIG. 2h schematically illustrates the semiconductor device 200 in a further advanced manufacturing stage. As illustrated, a first gate electrode structure 235A may be formed on the active region 202A and may comprise the gate dielectric material 210A, followed by the electrode material 213 and a further electrode material 214, which may also include any cap materials and the like, as may be required for the further processing of the device 200. Similarly, a second gate electrode structure 235B may be formed on the active region 202B and may comprise the gate dielectric material 210B, followed by the electrode material 213 and the further electrode material 214. The material 214 may comprise silicon material, a silicon/germanium material and the like, as is required for the further processing of the device 200 and for the desired overall device characteristics. It should be appreciated that, in some illustrative embodiments, the material 214 may be replaced by a highly conductive metal in a later manufacturing stage, i.e., after completing the basic transistor configurations in and above the active regions 202A, 202B.

The semiconductor device 200 as illustrated in FIG. 2h may be formed on the basis of similar process techniques as previously described with reference to the semiconductor device 100. That is, after forming the metal-containing electrode material 213, the material 214 may be deposited and may be subsequently patterned on the basis of sophisticated lithography and etch techniques in order to obtain the gate electrode structures 235A, 235B with a size in accordance with the design rules. For example, for sophisticated semiconductor devices, a gate length, i.e., in FIG. 2h, the horizontal extension of the electrode material 213, may be approximately 50 nm and less, such as 40 nm and less. Thereafter, a protection liner 209 may be formed so as to maintain integrity of sidewalls of the gate electrode structures 235A, 235B during the further processing.

Figure 2I:
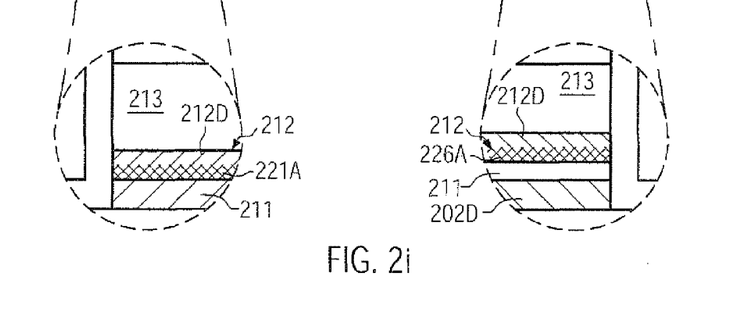

FIG. 2i schematically illustrates a portion of the gate electrode structures 235A, 235B in more detail. As illustrated, the gate electrode structure 235A may comprise the base layer 211 in combination with the high-k dielectric material 212, wherein the base layer 211 may have an enhanced stability, for instance, due to the incorporation of a nitrogen species and the like, which may be accomplished during the preceding treatment 207 (FIG. 2O. Furthermore, the dielectric material 212 may have incorporated therein a diffusion species, such as aluminum 226A, which may result, in combination with the semiconductor alloy 202D, in an appropriate threshold voltage for a P-channel transistor. Furthermore, the dielectric layer 212 may further comprise an appropriate species, such as nitrogen, oxygen and the like, which may have previously been incorporated to provide superior stability of the material 212.

Similarly, the gate electrode structure 235B may comprise the high-k dielectric material 212 formed above the base layer 211, wherein a diffusion species 221A, such as a lanthanum species and the like, may be incorporated in order to obtain the desired threshold voltage. Similarly, the layer 212 may comprise the species 212D for enhancing the stability of the material 212.

It should be appreciated that, if desired, the species 226A and 221A may also be incorporated into the base layer 211, thereby also modifying the characteristics thereof. For example, a silicon dioxide material may be converted into a silicate, thereby increasing the dielectric constant of the base material 211. Consequently, the above-described process sequence provides a high degree of flexibility in adjusting the overall transistor characteristics by appropriately modifying a sensitive gate dielectric material while nevertheless providing the different characteristics for N-channel transistors and P-channel transistors during a common manufacturing sequence.

Figure 2J:
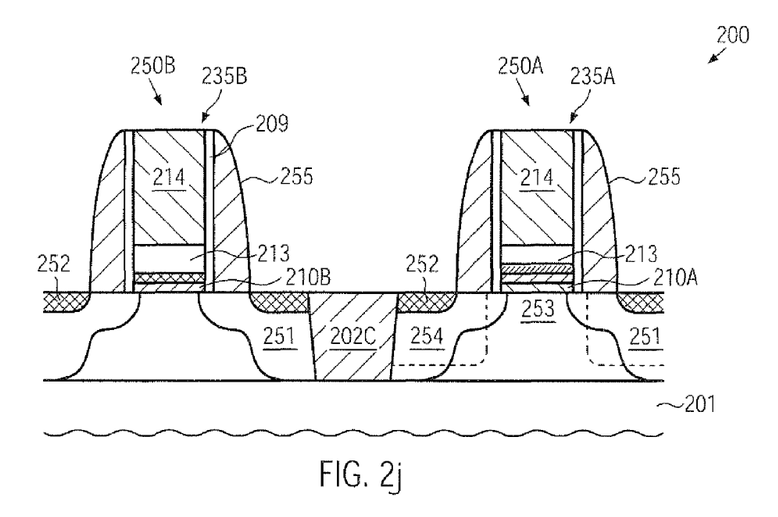

FIG. 2*j* schematically illustrates the semiconductor device 200 in a further advanced manufacturing stage. As illustrated, a first transistor 250A may be formed on the basis of the gate electrode structure 235A. Similarly, a second transistor 250B may be formed on the basis of the gate electrode structure 235B. As previously discussed, the transistors 250A, 250B may represent a P-channel transistor and an N-channel transistor, respectively. The transistors 250A, 250B may comprise drain and source regions 251 having any appropriate vertical and lateral dopant profile in accordance with the desired transistor characteristics. For example, the dopant profile of the drain and source regions 251 may be established on the basis of a spacer structure 255 formed on sidewalls of the gate electrode structures 235A, 235B. Furthermore, metal silicide regions 252 may be formed in the drain and source regions 251 and possibly in the gate electrode structures 235A, 235B, while, in other cases, as previously explained, the material 214 may comprise a cap material which may be removed in a later manufacturing stage when the remaining portion of the material 214 is to be replaced by a highly conductive metal. Furthermore, in some illustrative embodiments, one or both of the transistors 250A, 250B may comprise a strain-inducing semiconductor material 254 embedded in the corresponding active regions. For example, the transistor 250A may have formed therein the semiconductor alloy 254, for instance in the form of a silicon/germanium alloy, in order to induce a compressive strain in a channel region 253, thereby further enhancing overall performance of the transistor 250A. In other cases, a corresponding material, such as a silicon/carbon alloy and the like, may be provided in the transistor 250B in order to enhance the performance thereof.

The semiconductor device 200 as illustrated in FIG. 2*j* may be formed on the basis of the following process techniques. After patterning the gate electrode structures 235A, 235B, the material 254 may be formed, if required, by well-established process techniques in which cavities may be formed in the active region 202A and may be subsequently filled with the material 254 on the basis of selective epitaxial growth techniques. Thereafter, the drain and source regions 251 may be formed by ion implantation by using the spacer structure 255 as an implantation mask. Thereafter, any anneal processes may be formed, wherein the enhanced stability of the gate dielectric materials 210A, 210B may substantially preserve the previously adjusted characteristics, as discussed above. Next, the metal silicide regions 252 may be formed on the basis of well-established silicidation techniques. Thereafter, an interlayer dielectric material may be deposited which may comprise a stress-inducing dielectric material for enhancing performance of one or both of the transistors 250A, 250B. In some illustrative embodiments (not shown), the interlayer dielectric material may be patterned so as to expose the top surface of the gate electrode structures 235A, 235B in order to remove the material 214 and fill in any desired metal, such as aluminum, tungsten and the like.

As a result, the present disclosure provides semiconductor devices and manufacturing techniques in which the diffusion of threshold adjusting species into the dielectric material of transistor elements may be enabled at reduced temperatures and doses compared to conventional strategies. The material characteristics may be "preserved" by a subsequent treatment, for instance on the basis of nitridation or any other appropriate treatment, thereby providing the required superior stability during the further processing. During the diffusion of the cap layer species into the dielectric material, the species may also be incorporated into a base layer, if desired, thereby enhancing the dielectric characteristics thereof. Similarly, during the subsequent treatment for stabilizing the sensitive gate dielectric material, a corresponding treatment of the base layer may be accomplished, for instance, by incorporating nitrogen and the like. Hence, after stabilizing the material characteristics of the sensitive gate dielectric material, the further processing may be performed by depositing a single metal-containing electrode material, thereby further enhancing the overall process efficiency. In some cases, the interdiffusion of material into the gate dielectric material in an early manufacturing stage may also be applied to silicon dioxide-based materials, wherein a subsequent treatment, such as a nitridation, may thus conserve previously adjusted material characteristics. Thereafter, a "conventional" electrode material, such as polysilicon, amorphous silicon, silicon/germanium and the like, may be deposited.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
a first active region;
a first gate electrode structure formed on said first active region, said first gate electrode structure comprising a dielectric base material and a high-k dielectric material formed on said dielectric base material, said high-k dielectric material comprising a first threshold adjusting metal species in said first gate electrode structure;
a second active region;
a second gate electrode structure formed on said second active region, said second gate electrode structure comprising said dielectric base material and said high-k dielectric material formed on said dielectric base material, said high-k dielectric material comprising a second threshold adjusting metal species in said second gate electrode structure; and
a metal-containing electrode material, said metal-containing electrode material being formed on said high-k dielectric material in said first and second gate electrode structures.

2. The semiconductor device of claim 1, wherein said first threshold adjusting species comprises aluminum and said second threshold adjusting species comprises lanthanum.

3. The semiconductor device of claim 1, wherein said first gate electrode structure is formed on a threshold adjusting semiconductor alloy.

4. The semiconductor device of claim 1, wherein said metal-containing electrode material comprises titanium and nitrogen.

5. The semiconductor device of claim 1, wherein said first and second gate electrode structures further comprise a further electrode material formed on said metal-containing electrode material.

6. The semiconductor device of claim 5, wherein said further electrode material comprises silicon.

7. The semiconductor device of claim 1, wherein said high-k dielectric material in said first and second gate electrode structures forms an interface with said metal-containing electrode material and wherein said high-k dielectric material comprises at least one of nitrogen and oxygen at said interface so as to stabilize said interface.

* * * * *